(12) United States Patent
Herman

(10) Patent No.: US 11,817,340 B2
(45) Date of Patent: Nov. 14, 2023

(54) SYSTEM AND METHOD FOR IMPROVED ELECTROSTATIC CHUCK CLAMPING PERFORMANCE

(71) Applicant: Advanced Energy Industries, Inc., Fort Collins, CO (US)

(72) Inventor: Donnie Herman, Olcott, NY (US)

(73) Assignee: Advanced Energy Industries, Inc., Denver, CO (US)

(*) Notice: Subject to any disclaimer, the term of this patent is extended or adjusted under 35 U.S.C. 154(b) by 379 days.

(21) Appl. No.: 17/243,180

(22) Filed: Apr. 28, 2021

(65) Prior Publication Data

US 2022/0367225 A1    Nov. 17, 2022

(51) Int. Cl.
    *H01L 21/683*    (2006.01)
    *G06N 3/04*      (2023.01)

(52) U.S. Cl.
    CPC .......... *H01L 21/6833* (2013.01); *G06N 3/04* (2013.01)

(58) Field of Classification Search
    CPC ...... H01L 21/6833; H02N 13/00; G06N 3/04; G06N 3/08; G06N 3/048
    USPC ........................................................ 361/234
    See application file for complete search history.

(56) References Cited

U.S. PATENT DOCUMENTS

| 5,075,869 | A  | 12/1991 | Holler et al. |
| 8,108,328 | B2 | 1/2012  | Hench |
| 8,514,544 | B2 | 8/2013  | McAnn et al. |

| 2005/0199341 | A1* | 9/2005  | Delp ............... H01J 37/32 156/345.24 |
| 2005/0220984 | A1* | 10/2005 | Sun ............... H01J 37/32935 118/723 R |
| 2009/0200281 | A1  | 8/2009  | Hampton |
| 2011/0032654 | A1* | 2/2011  | McAnn ............... H01L 21/6833 361/234 |
| 2017/0162415 | A1* | 6/2017  | Uehara ............... H01G 7/02 |

(Continued)

FOREIGN PATENT DOCUMENTS

| WO | 2015120419 A1 | 8/2015 |
| WO | 2020205339 A1 | 10/2020 |

OTHER PUBLICATIONS

Trek, Inc., "The Electrostatic Semiconductor Wafer Clamping/Chucking System (ESC)", Trek Application Note No. 6002, 2013, pp. 1-8.

(Continued)

*Primary Examiner* — Kevin J Comber
(74) *Attorney, Agent, or Firm* — Neugeboren O'Dowd PC

(57) ABSTRACT

A power supply comprises at least one waveform generator that produces a clamp waveform responsive to a clamp signal, and at least one amplifier that amplifies and provides the clamp waveform to an electrostatic chuck. An advisor module receives parameter values for parameters affecting operation of the power supply, uses a neural network to determine whether the parameter values are consistent with trained parameter values, and continuously and automatically modifies weighting of inputs to the neural network when any parameter values are inconsistent with the trained parameter values. A controller provides the clamp signal to the waveform generator, receives reports from the advisor module, and adjusts the clamp signal or provides a status report when any parameter values are inconsistent with the trained parameter values.

17 Claims, 14 Drawing Sheets

(56) References Cited

U.S. PATENT DOCUMENTS

2017/0358431 A1   12/2017  Dorf et al.
2019/0066982 A1*   2/2019  Sato ................. H01L 21/67253

OTHER PUBLICATIONS

KIPO, "International Search Report and Written Opinion Regarding International Application No. PCT/US2022/020536", dated Jul. 14, 2022, pp. 9, Published in: KR.

* cited by examiner

| | ESC capacitance | ESC resistance | ESC voltage | ... | OUTPUT BOX e-chuck |
|---|---|---|---|---|---|
| TRAIN DATA 1 | 32768 | 45643 | 32345 | ... | 1 |
| TRAIN DATA 2 | 30123 | 305523 | 306534 | ... | 1 |
| TRAIN DATA 3 | 29281 | 45281 | 29278 | ... | 0 |
| ... | ... | ... | ... | ... | ... |
| TRAIN DATA n | 27748 | 36548 | 57748 | ... | 1 |

*FIG. 10*

SYSTEM AND METHOD FOR IMPROVED ELECTROSTATIC CHUCK CLAMPING PERFORMANCE

BACKGROUND

Field

The present disclosure relates generally to electrostatic chucks, and more specifically, to a power supply for an electrostatic chuck with features relating to performance monitoring and system health.

Background

An electrostatic chuck (ESC) is used in a variety of semiconductor processes to hold a workpiece such as a wafer during processing. ESCs employ a platen with integral electrodes that are biased with high voltage to establish an electrostatic holding force between the platen and wafer, thereby "chucking" the wafer.

An ESC typically comprises a power supply that produces a clamp waveform to provide a clamp voltage to the ESC. However, ESC power supplies currently lack features relating to performance monitoring and system health. One of the most critical features in the ESC field is increasing the yield of successfully processed workpieces. Any feature that can be added to reduce downtime or improve diagnostics can result in millions of dollars of savings for the end user.

SUMMARY

According to one aspect of the invention, a power supply is provided. The power supply comprises at least one waveform generator configured to produce a clamp waveform responsive to a clamp signal, and at least one amplifier configured to amplify and provide the clamp waveform to an electrostatic chuck. An advisor module is configured to receive a representation of parameter values for parameters affecting operation of the power supply, use a neural network to determine whether the parameter values are consistent with trained parameter values, and to modify weighting of inputs to the neural network when any parameter values are inconsistent with the trained parameter values. A controller is configured to provide the clamp signal to the waveform generator, receive reports from the advisor module, and perform at least one of adjusting the clamp signal or providing a status report when any parameter values are inconsistent with the trained parameter values.

According to another aspect of the invention, a non-transitory processor-readable medium encoded with instructions for monitoring power applied by a power supply is disclosed. The instructions comprising instructions to receive a representation of parameter values affecting current operating conditions of the power supply, access trained parameter values corresponding to previous operation of the power supply, update a plurality of weights of inputs to a neural network based at least in part on the parameter values affecting current operating conditions of the power supply, and perform at least one of adjusting a clamp signal or providing a status report when the parameter values are inconsistent with the trained parameter values.

According to a further aspect of the invention, a processing system comprises a plasma processing chamber comprising an electrostatic chuck. A power supply comprises at least one waveform generator configured to produce a clamp waveform responsive to the clamp signal, and at least one amplifier configured to provide an amplified clamp waveform to the electrostatic chuck. The processing system further comprises means for receiving a representation of parameter values for parameters affecting operation of the power supply, means for processing the parameter values to determine whether the parameter values are consistent with trained parameter values, and means for modifying weighting of parameter values when any parameter values are inconsistent with the trained parameter values. A controller is configured to provide a clamp signal to the waveform generator, and to perform at least one of adjusting the clamp signal or providing a status report when any parameter values are inconsistent with the trained parameter values.

BRIEF DESCRIPTION OF THE DRAWINGS

FIG. 10 is a table showing exemplary training of the neural network for multiple parameter values;

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
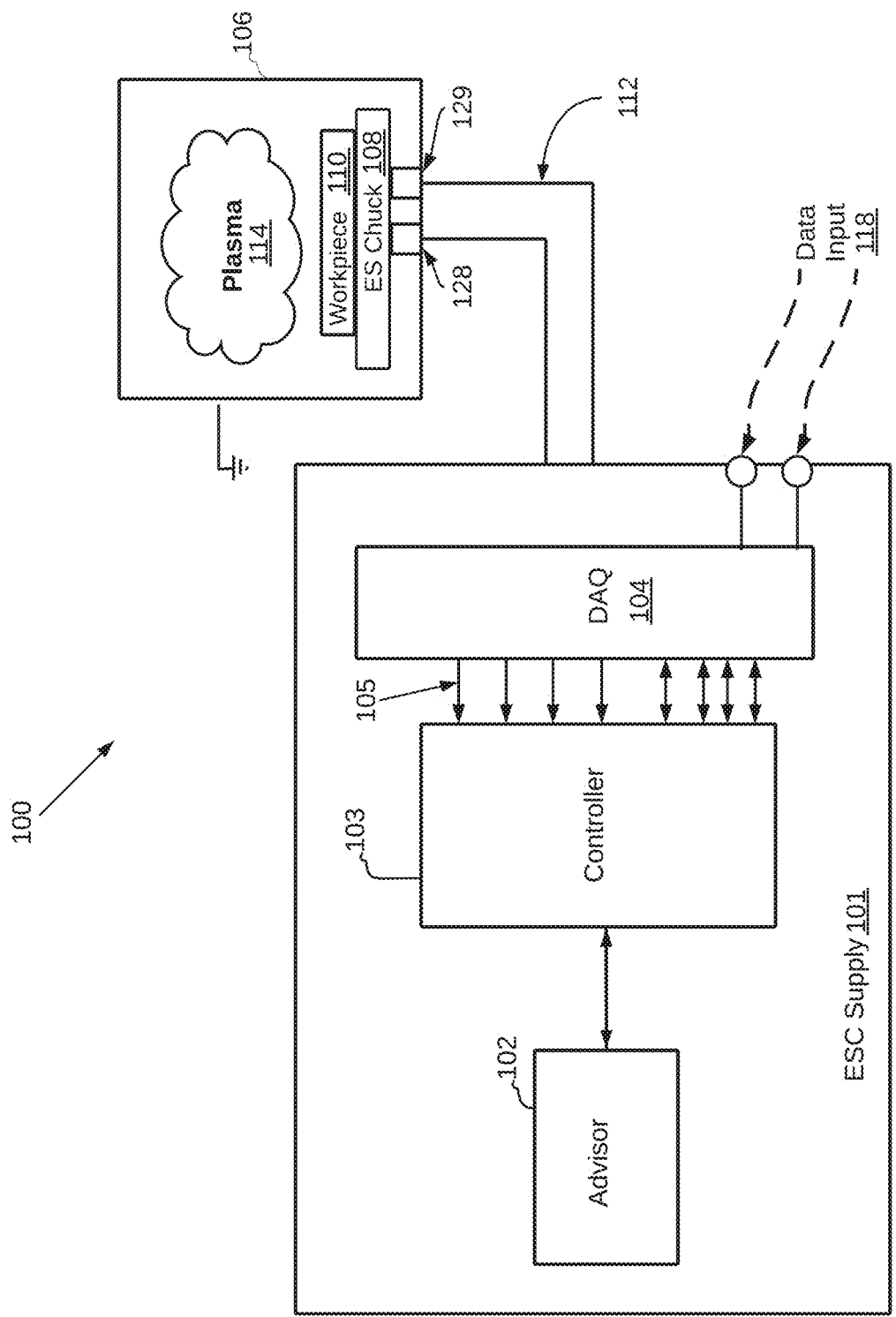
FIG. 1 is a block diagram depicting an environment in which aspects of the present invention are implemented.

FIG. 1 is a block diagram depicting an exemplary environment in which the present invention may be implemented. System 100 of FIG. 1 comprises an electrostatic chuck (ESC) power supply 101 in communication, via conductors 112, with an ESC 108 housed within a plasma processing chamber 106 containing plasma 114. Power supply 101 provides clamp signals via conductors 112 to clamp electrodes 128, 129 of ESC 108 in order to chuck (clamp) a workpiece 110, such as a silicon wafer, to ESC 108. As will be described herein, system 100 monitors various operational and health parameters of ESC 108. As will be shown in more detail in FIG. 3, power supply 101 also typically comprises other components comprising waveform generators 120, 121 and high voltage amplifiers 122, 123 through which clamp signals pass before being output to clamp electrodes 128, 129.

ESC power supply 101 comprises a controller 103 in two-way communication with an advisor module 102. Here, it should be noted that controller 103 and advisor module 102 may be distributed as separate components residing within separate housings, as shown in FIG. 1, or alternatively may be realized as a single, unitary device. In one embodiment, controller 103 and advisor module 102 are separate components installed on a controller printed circuit board (PCB), which in turn is implemented in power supply 101.

Controller 103 is also in two-way communication with data acquisition system (DAQ) 104. DAQ 104 comprises sensors for continuously sensing and recording values of real time operational and health parameters 105 from the electrostatic chucking system, and continuously streams the operational parameter values 105 to controller 103. In one implementation, DAQ 104 also comprises an analog to digital converter to convert analog signals received from its various sensors into digital signals to be input into controller 103. DAQ 104 further receives user definable inputs 118 which may be, for example, threshold settings of the various sensors of DAQ 104.

Controller 103, in turn, streams parameter values 105 received from DAQ 104 to advisor module 102, which uses a trained neural network to detect inconsistencies or faults in parameter values 105 as compared to previously trained parameter values. Advisor module 102 continuously reports its detected results back to controller 103, which then takes appropriate action. Actions that may be taken by controller 103 include, for example, adjusting the clamp signal, providing a status report, setting an alarm or system flag, allowing the system to attempt to correct the issue itself before shutting down safely, automatically reducing output current if a fault or oscillation was predicted or sensed, or providing a special declamp waveform via conductors 112 to clamp electrodes 128, 129 to release a stuck wafer.

Figure 2:
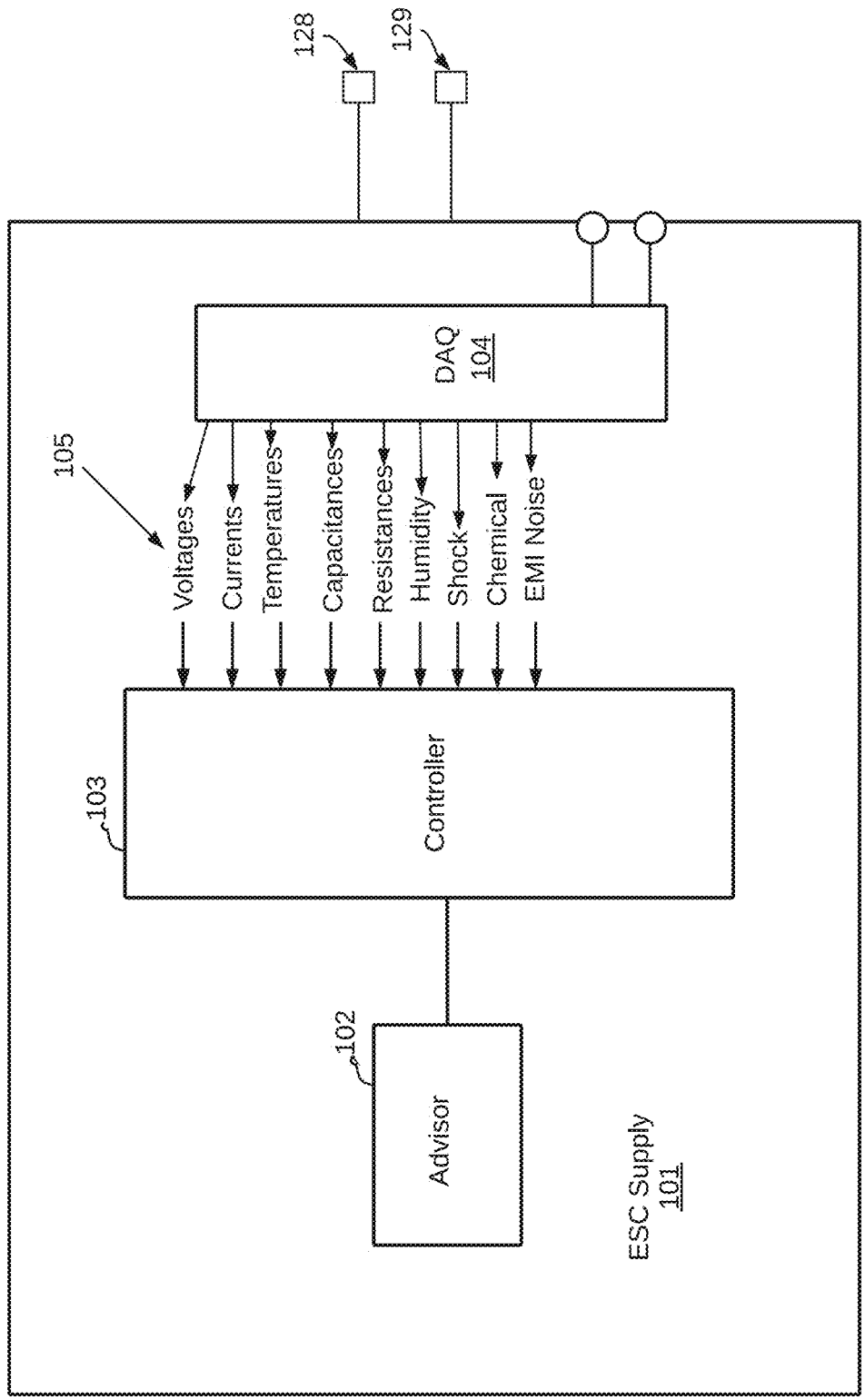
FIG. 2 is a block diagram showing aspects of the exemplary ESC power supply of FIG. 1 in more detail.

FIG. 2 is a block diagram showing certain aspects of ESC power supply 101 in more detail. In particular, FIG. 2 shows various operational parameters 105 that may be continuously sensed and streamed in real time from DAQ 104 to controller 103. Operational parameters 105 may include, for example, and without limitation, voltages, currents, temperatures, capacitances, resistances, humidity, shock, chemical and EMI noise.

Figure 3:
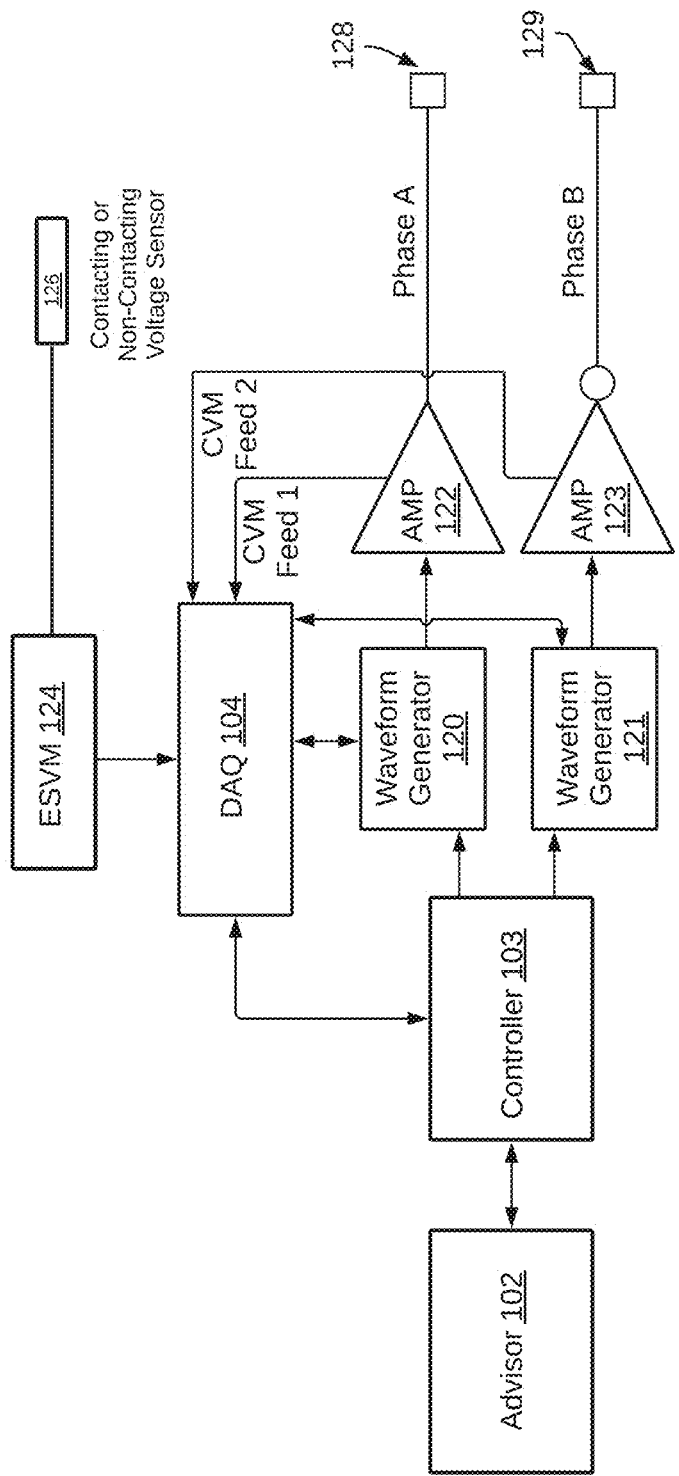
FIG. 3 is a schematic diagram showing additional exemplary aspects of the ESC power supply of FIG. 1.

FIG. 3 is a schematic diagram showing additional aspects of ESC power supply 101. Controller 103 outputs a clamp signal, which is typically low voltage, to waveform generators 120, 121. Although FIG. 3 shows two waveform generators, one or more waveform generators may alternatively be used. Waveform generators 120, 121 produce a clamp waveform (see FIGS. 4 and 5) that is output to high voltage amplifiers 122, 123. DAQ 104 may also be in two-way communication with waveform generators 120, 121. Operational parameters 105 may include data that is provided by waveform generators 120, 121 to DAQ 104, such as voltages and currents within or output by waveform generators 120, 121.

Amplifiers 122, 123 are high voltage amplifiers that amplify the clamp waveform in order to provide a high voltage clamp waveform to clamp electrodes 128, 129. Although two amplifiers are shown in FIG. 3, one or more amplifiers may alternatively be used. In one implementation, amplifier 122 outputs a phase A (positive) clamp waveform to electrode 128, and amplifier 123 outputs a phase B (negative) clamp waveform to electrode 129. Electrodes 128, 129 clamp workpiece 110 to the ESC 108 via capacitive forces in accordance with a particular clamping sequence that is dictated by the shape of the clamp waveforms.

DAQ 104 may be communicatively connected to amplifiers 122, 123 in a manner that allows DAQ 104 to sense and monitor operation of the clamping operation. As shown in FIG. 3, feed lines CVM (current/voltage monitor) Feed 1 and CVM Feed 2 provide information to DAQ 104, such as voltages and currents existing within and output by amplifiers 122, 123. Operational parameters 105 may include data provided from amplifiers 122, 123 to DAQ 104, such as voltages and currents existing within or output by amplifiers 122, 123.

In one implementation, the system is also equipped with an electrostatic voltmeter (ESVM) 124, which has a contacting or non-contacting voltage sensor 126 that may be positioned near a surface of workpiece 110 to provide, for example, feedback as to the residual voltage on workpiece 110 after a declamp sequence has been executed. The residual voltage detected by ESVM 124 is an indicator of the success of eliminating residual charge after the declamp process is complete. The success of a declamp process may be gauged by how close the residual voltage is to zero.

ESVM 124 is generally configured to monitor a voltage of workpiece 110. ESVM 124 may be realized by a variety of different topologies, but in general, when engaged and coupled to the workpiece 110, ESVM 124 is a high impedance device that monitors the voltage of workpiece 110 without substantially affecting the voltage of the workpiece 110. The voltages detected by EVSM 124 may be indicative of various aspects of the health and performance of system 100. Voltages measured by EVSM 124 are provided to DAQ 104, and operational parameters 105 may comprise workpiece voltage data provided by ESVM 124 to DAQ 104.

As discussed above, power supply 101 outputs a high voltage clamp waveform to electrodes 128. Most ESC power supply requirements are 2 to 6 output phases between +/−1 kV to +/−3 kV per phase. The output current is usually around 10 mA DC. A wide range of clamp waveforms may be generated in order to optimize the performance of the clamping and de-clamping process by controlling the ramp, overshoot and duration of the high voltage signal. Waveforms may be customized by the user to produce waveforms that have tailored risetime, controlled overshoot, adjustable bias and sophisticated trailing edge shape. The clamping waveform may be optimized to address issues of minimum clamping time, variation in clamping force during workpiece processing, as well as workpiece charging control to minimize workpiece "sticking" to the platen, etc. Importantly, according to the present invention, the shape and characteristics of the clamp waveform may be modified by controller 103 in response to detections of inconsistencies between trained parameter values and field parameter values detected by advisor module 102.

Figure 4:
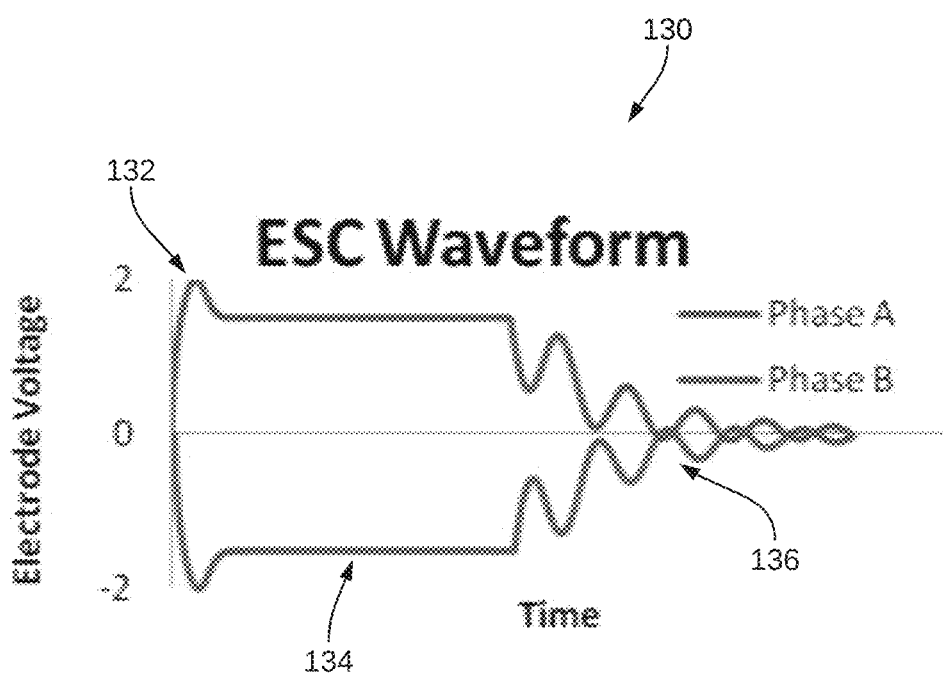
FIG. 4 is a graph depicting a first exemplary clamp waveform.

FIG. 4 shows a first example of a clamp waveform 130. Waveform 130 has an intentional overshoot region 132 to pull workpiece 110 firmly in place, a flat clamping region 134 and an oscillatory tail or "ringing" region 136 intended to minimize any residual charge that might otherwise remain on workpiece 110 after the process is complete. According to the present invention, any of portions 132, 134 and 136 of clamp waveform 130 may be adjusted by controller 103 in response to inconsistencies between trained parameter values and field parameter values detected by advisor module 102.

Figure 5:
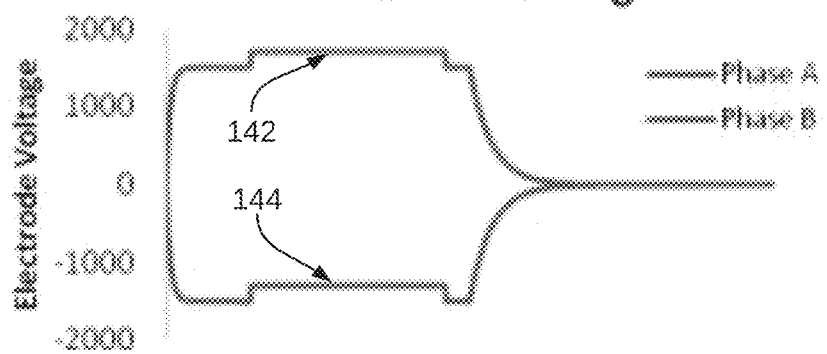
FIG. 5 is a graph depicting a second exemplary clamp waveform.

FIG. 5 shows a second example of a clamp waveform 140. Waveform 140 is tailored to offset the effect that plasma in a process chamber may create a voltage offset at the ESC. This voltage in conjunction with the electrode voltage changes the potential difference across the ESC 108 and can cause a discharge across the chuck dielectric or to workpiece 110 itself. Either can result in damage. To account for this offset, a bias voltage is applied to each of the signals at electrodes 128, 129 during the time that plasma is present. As can be seen in FIG. 5, this adds to phase A at region 142, and subtracts from phase B at region 144. According to the present invention, the bias voltage may be adjusted by controller 103 in response to inconsistencies between trained parameter values and field parameter values detected by advisor module 102.

As previously mentioned, controller 103 streams operational parameter values 105 sensed by DAQ 104 to advisor module 102, which comprises a neural network 150 that detects inconsistencies, faults or anything unique in incoming parameter values 105 as compared to trained parameter values. A neural network (NN), or artificial neural network (ANN), is a subset of learning algorithms that are loosely based on the concept of biological neural networks. Essentially, controller 103 seeks continuous "advisement" about patterns of sensed operational parameters of system 100, and advisor module 102 through use of neural network 150 provides indications of any degrees of change in the patterns of the operational parameters as compared to existing trained parameters.

As will be described with reference to FIG. 12, neural network 150 is initially trained in a controlled process to recognize patterns of the various operational parameter values 105 that correspond to normal or acceptable operation of system 100, as well as to recognize patterns of operational parameter values 105 that correspond to a fault condition or unacceptable operation of system 100. In field operation, after the initial training, neural network 150 continues to be trained by recognizing any new patterns of operational parameter values and, based on user feedback, either classifying those patterns as corresponding to acceptable operation or corresponding to a fault condition. In this way, neural network 150 develops and refines its pattern-recognition accuracy over time.

Figure 6:
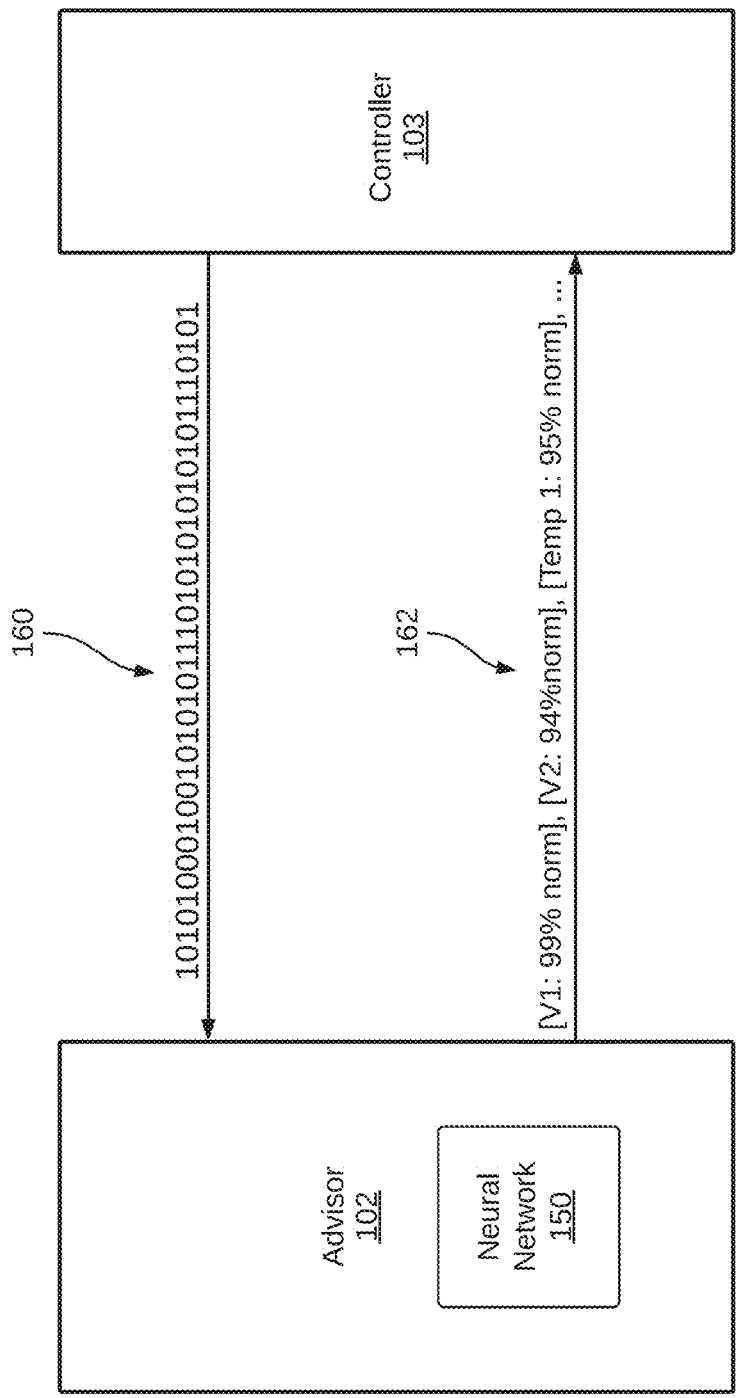
FIG. 6 is a block diagram depicting communication flow between a controller and an advisor module according to an aspect.

FIG. 6 is a block diagram showing communication between controller 103 and advisor module 102. Controller 103 and advisor module 102 may connect, for example, via serial peripheral interface (SPI) or serial RxTx and continuously stream data back and forth. It should be understood, however, that the particular communication means between controller 103 and advisor module 102 is not critical—it could be any type of communication means. As discussed further herein, the data representing operational parameter values 105, such as temperature, current, voltage, etc., may be continuously streamed from controller 103 to advisor module 102, and advisor module 102 may continuously compare current operation parameter values with trained parameter values, adjusting weights applied to those parameter values as needed, and streaming results back to controller 103.

Figure 7:
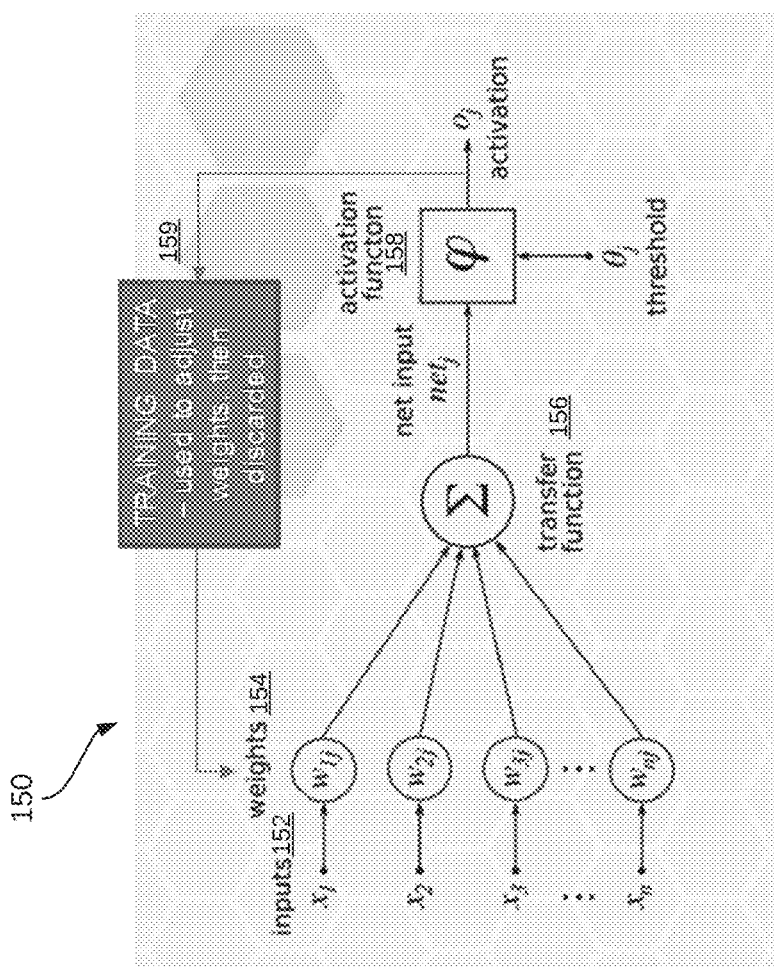
FIG. 7 is a schematic diagram showing the structure of an exemplary neural network.

In one embodiment, raw data representative of operational parameter values 105 is continuously streamed from controller 103 to advisor module 102 in an organized way in the form of input bit stream 160. Advisor module 102 uses neural network 150 to determine whether the parameter values are consistent with trained parameter values, and as described with reference to FIG. 7, continuously and automatically modifies the weighting of inputs to neural network 150 when the incoming parameter values are inconsistent with the training parameter values. Thus, advisor module 102 performs operations on the incoming parameter values to provide a report to controller 103 of whether and how far out of normal range operational parameters such as voltages, current, temperature, capacitance, etc. are, or conversely, whether the incoming parameter values are within normal ranges. By use of neural network 150, sophisticated and superimposed value changes can be detected and correlated with a unique or fault condition that may not ordinarily or easily be detected by a human operator.

The result of this process is an update or report of the specific or general health of any parameter or set of parameters that is streamed at 162 by advisor module 102 back to controller 103. For example, as shown in FIG. 6, based on the current operational parameter input stream 160, advisor module is reporting back that the voltage parameter V1 is at 99% of normal, that the voltage parameter V2 is at 94% of normal, and that the temperature parameter Temp 1 is at 95% of normal. In addition, as described in more detail below, controller 103 may automatically take action such as adjusting the clamp signal in response to fault conditions, i.e., inconsistencies between current parameter values and trained parameter values.

Neural network 150, in addition to providing health/operational reports on specific parameters, also updates weights applied to the input parameter values based on inconsistencies with trained parameter values, and may also provide more general health reports on any weighted combination of parameters or on the entire system. This is illustrated in more detail in FIG. 7, which is a diagram showing the structure of an exemplary neural network 150. Neural network 150 may take the form of, for example, computer-readable instructions coded in the Python programming language. Neural network 150 comprises inputs 152 ($x_1, x_2, x_3 \ldots x_n$), weights 154 ($w_{1j}, w_{2j}, w_{3j} \ldots w_{nj}$), transfer function 156 ($\Sigma$), activation function 158 ($\varphi$) and feedback training data 159.

Inputs ($x_1, x_2, x_3 \ldots x_n$) correspond to the operational or field parameter values that are continuously streamed from controller 103 to advisor module 102. For example, $x_1$ may be a temperature parameter value, $x_2$ may be a voltage parameter value $x_3$ may be a current parameter value, and so on. Weights ($w_{1j}, w_{2j}, w_{3j} \ldots w_{nj}$) correspond to weights or coefficients that are assigned to each input ($x_1, x_2, x_3 \ldots x_n$). Weights ($w_{1j}, w_{2j}, w_{3j} \ldots w_{nj}$) may be, for example, a value from −1 to +1. Weights ($w_{1j}, w_{2j}, w_{3j} \ldots w_{nj}$) are initially generated in training the model, and a bigger weight value is assigned to more important inputs ($x_1, x_2, x_3 \ldots x_n$). These weights are continuously and automatically modified when any input parameter values are inconsistent with trained parameter values. In addition, weights are adjusted based on user feedback. For example, if a user reports a fault condition or anomaly based on some parameter value or combination of parameter values, that parameter value may be assigned a higher weight. Weights are incremented or decremented over time based on the learned importance of the input parameters associated with those weights.

Each input ($x_1, x_2, x_3 \ldots x_n$) is multiplied by each weight ($w_{1j}, w_{2j}, w_{3j} \ldots w_{nj}$). This controls the significance and impact of each input in the same manner as brain synapses, which simulate the neurotransmitters that are passed among biological neurons. The weighted inputs are then summed at the transfer function 156 (Σ). Thus, Σweight$_1$·input$_1$=weight$_1$·input$_1$+weight$_2$·input$_2$+weight$_3$·input3 . . . +weight$_n$·input$_n$. The summed weights impact how significant total changes are, controlling the level of reaction of the system. The summed weighted input value is dynamic and continuously and automatically modified based on inconsistencies between current parameter values and trained parameter values.

Figure 8:
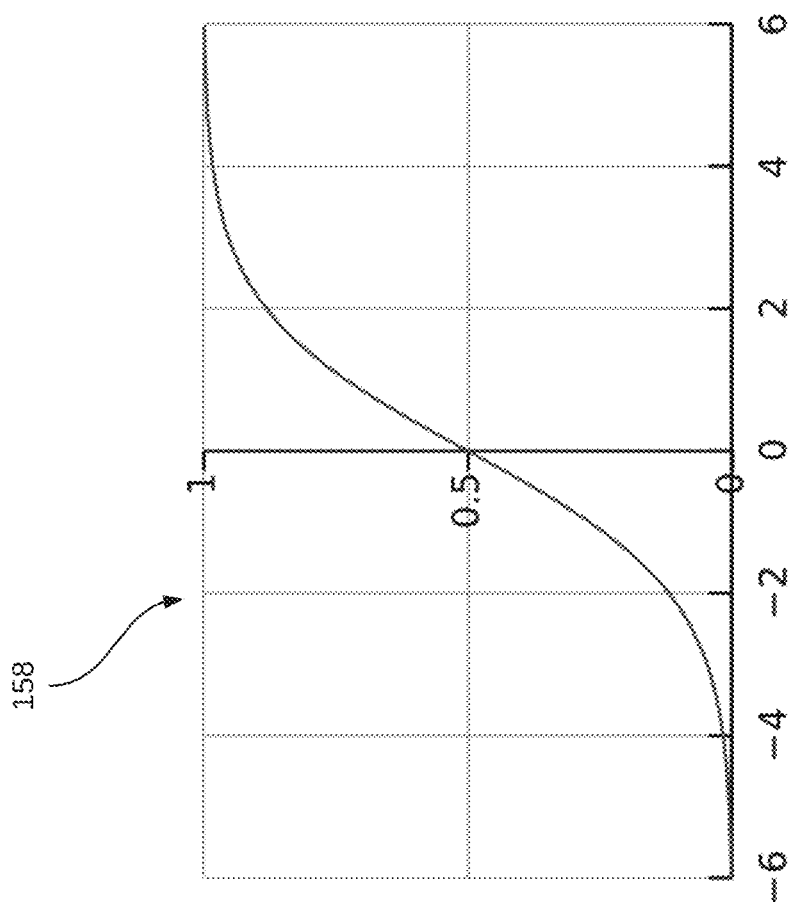
FIG. 8 is a graph depicting an exemplary sigmoid activation function.

Activation function 158 ($\varphi$) applies a threshold or bias Ø$_j$ to the summed weighted inputs (net input net$_j$), and an activation function is applied to generate an activation output o$_j$ that is a number between zero and one. In one implementation, the activation function is a sigmoid activation function. A sigmoid activation function 158 is illustrated in the graph of FIG. 8. Sigmoid activation function 158 is $S(x)=1/(1+e^{-x})=e^x/(e^x+1)$, where x is a dot product of a transposed matrix. The sigmoid activation function is depicted by a characteristic "S"-shaped curve, and can map any value to a value from 0 to 1 to assist in normalizing the weighted sum of the inputs net$_j$. Mathematically, the model is trained by applying the dx/dt chain rule and sigmoid function to normalize the output to one or zero. This is repeated in a loop (feedback training data 159) from one times to millions of times to converge the error in a fault state to as close to zero as possible, or to converge in a normal state to as close to one as possible. Thus, in this manner, based on a dynamic weighted combination of operational parameters 105, neural network 150 continuously provides an indication of the general health of system 100, and is able to predict and react to fault or other unique conditions as they arise.

Figure 9:
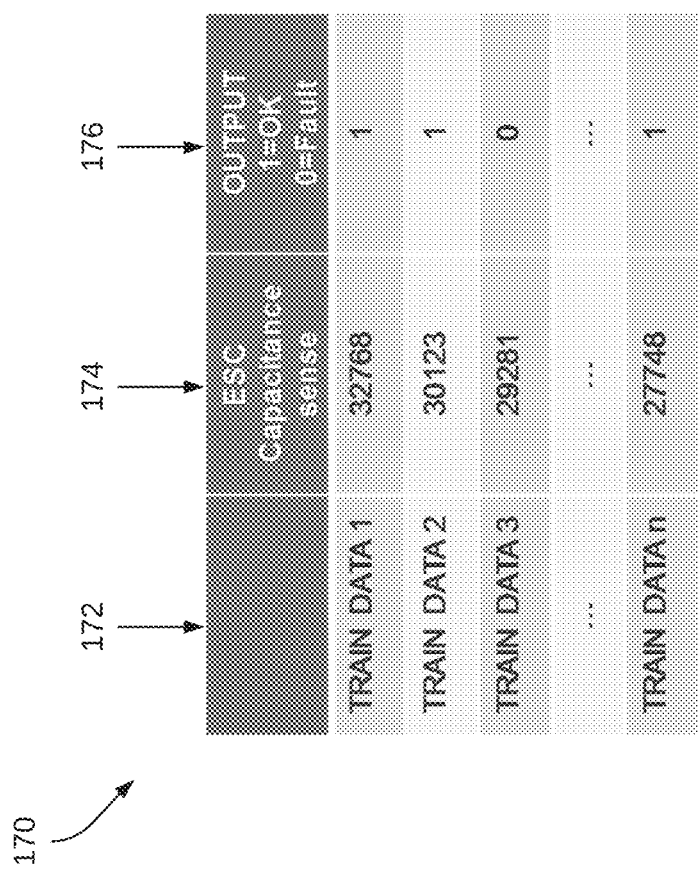
FIG. 9 is a table showing exemplary training of the neural network for one parameter value according to an aspect.

FIG. 9 is a table 170 showing training of neural network 150 for one exemplary operational parameter, in this case, a capacitance value. Column 172 lists n specific training data instances or scenarios, i.e. TRAIN DATA 1 . . . TRAIN DATA n. Column 174 shows a parameter value corresponding to each of those scenarios, in this case, a parameter value corresponding to a sensed capacitance. The parameter values shown in column 174 may also be represented as 16 bit numbers. Column 176 indicates whether that training data instance or scenario corresponds to a normal (1=OK) or a fault (0=Fault) condition.

In this example, with respect to TRAIN DATA 3, something about this capacitance value caused workpiece 110 to drop shortly after, and thus results in a fault (0) output being associated with this particular capacitance value. Thus, if this capacitance value occurs again after training, the issue can be safely handled in a predetermined manner. In this manner, individual parameter values can be correlated with a normal or fault output condition. By comparing the continuously measured capacitance values with the trained capacitance values in table 170, neural network 150 can provide an ongoing assessment of the health of that particular capacitance parameter, updates weights applied to the capacitance parameter, and continuously expands and deepens its pattern recognition and prediction ability as it is trained by new parameter values.

Multiple parameter values can be combined in the training model where many conditions are realized before creating a fault alert. FIG. 10 is a table 180 showing training of neural network 150 for multiple exemplary parameters, in this case, capacitance, resistance and voltage parameter values. Column 182 lists n specific training data instances or scenarios, i.e. TRAIN DATA 1 . . . TRAIN DATA n. Columns 184, 186 and 188 show parameter values corresponding to each of those scenarios, in this case, parameter values corresponding to a sensed capacitance (column 184), a sensed resistance (column 186) and a sensed voltage (column 188). As with FIG. 9, the parameter values shown in columns 184, 186, 188 may also be represented as 16 bit numbers. Column 189 indicates whether that training data instance or scenario corresponds to a normal (1=OK) or a fault (0=Fault) condition.

In the example of FIG. 10, with respect to TRAIN DATA 3, something about this combination of capacitance, resistance and voltage value resulted in a fault (0) output, and may be associated with a particular condition, such as, for example, clamp fault risk. Thus, if this particular combination of capacitance, resistance and voltage values occurs again after training, the issue can be safely handled in a predetermined manner. In this manner, a combination of multiple parameter values can be correlated with a particular condition, and by comparing those values at any given time with the trained values, neural network 150 can predict the likelihood of that condition occurring. Again, neural network 150 is continuously trained and updated as new combinations of parameter values are encountered, and weights applied by neural network 150 to those parameter values are modified based on inconsistencies with trained parameter values.

Figure 11:
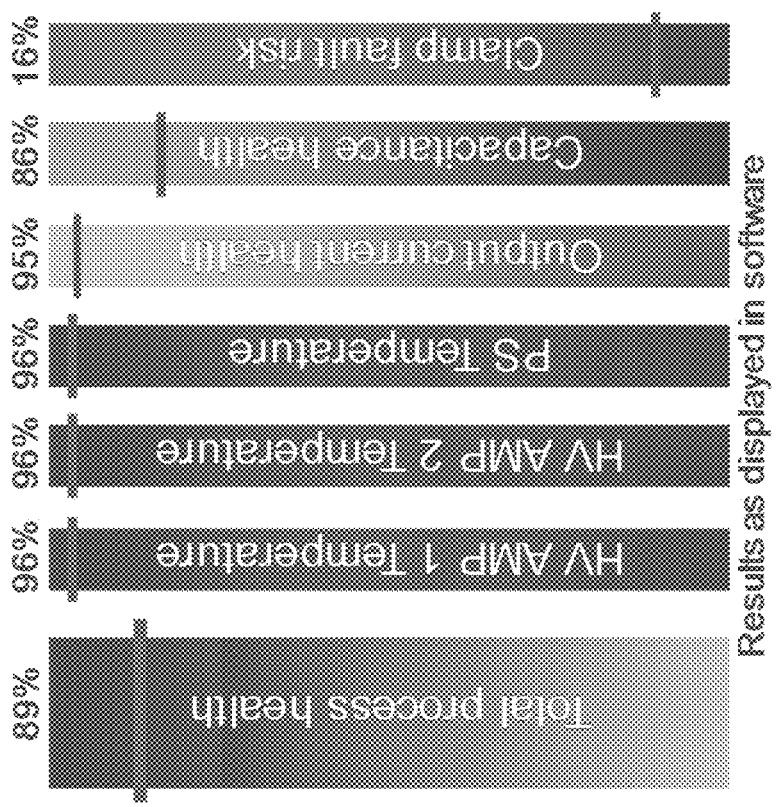
FIG. 11 is a diagram illustrating updates or reports of status or health that may be provided by the advisor module.

FIG. 11 is a diagram illustrating exemplary updates or reports of status or health that may be provided by advisor module 102 after performing the processes described above. As shown in FIG. 11, these reports or updates may include the total health of the system or process as determined with respect to FIG. 7, which in this example is 89% of normal. The reports or updates may also provide the health or degree of normalcy of individual operational parameters. In the example of FIG. 11, the temperature of high voltage amps (HV AMPs) 1 and 2 are at 96% of normal; the power supply (PS) temperature is at 96% of normal, the output current health is at 95% of normal, and the capacitance health is at 86% of normal. In addition, the reports or updates may include a probability or prediction that a certain condition will occur. In the example of FIG. 11, advisor module 102 reports that there is a 16% risk that a clamp fault will occur. These reports or updates are customizable by the user and may include individual reports on any parameter, combination of parameters, condition or overall system health. The updates or reports may be displayed to the user, for example, in display 512 of FIG. 14.

Figure 12:
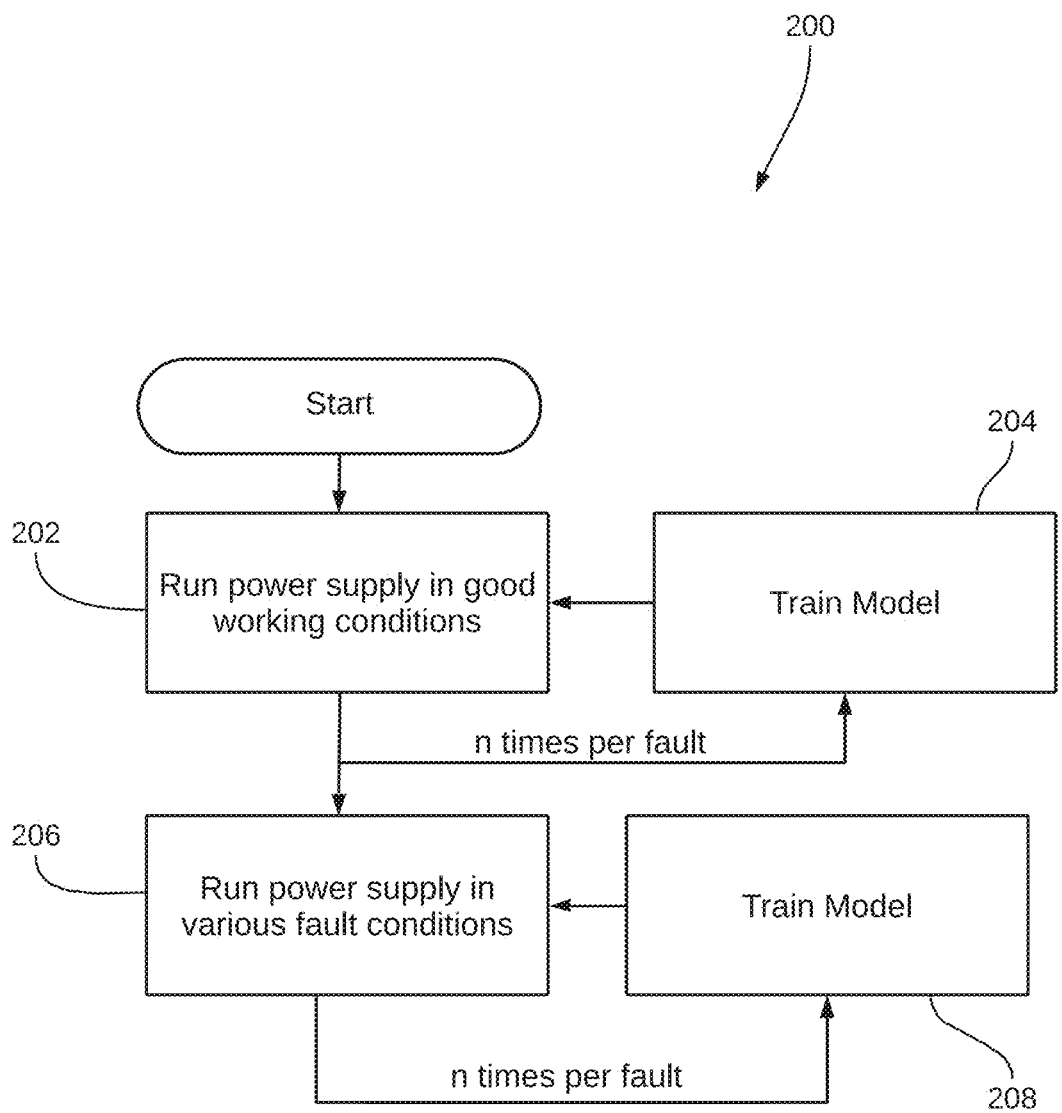
FIG. 12 is a flowchart depicting an exemplary method for initial training of the neural network according to the invention, before the power supply is put into field use.

FIG. 12 depicts an exemplary method 200 for initial training of neural network 150, before power supply 101 is put into field use. In step 202, power supply 101 is run in good working condition. If any faults are detected, the neural network model is trained in step 204, n times per fault. In one implementation, n is 10,000. After training of power supply 101 in good working conditions is complete, in step 206, power supply 101 is run in various known fault conditions for n times per fault, and the neural network model is trained in step 208. Again, in one implementation, n is 10,000. The training in steps 204 and 208 may comprise, for example, assembling tables such as those shown in FIGS. 9 and 10 correlating various parameter values and combinations of values with a fault (0) or a normal (1) value. Literally millions of specific scenarios may be trained in this manner to produce trained parameter values.

Figure 13:
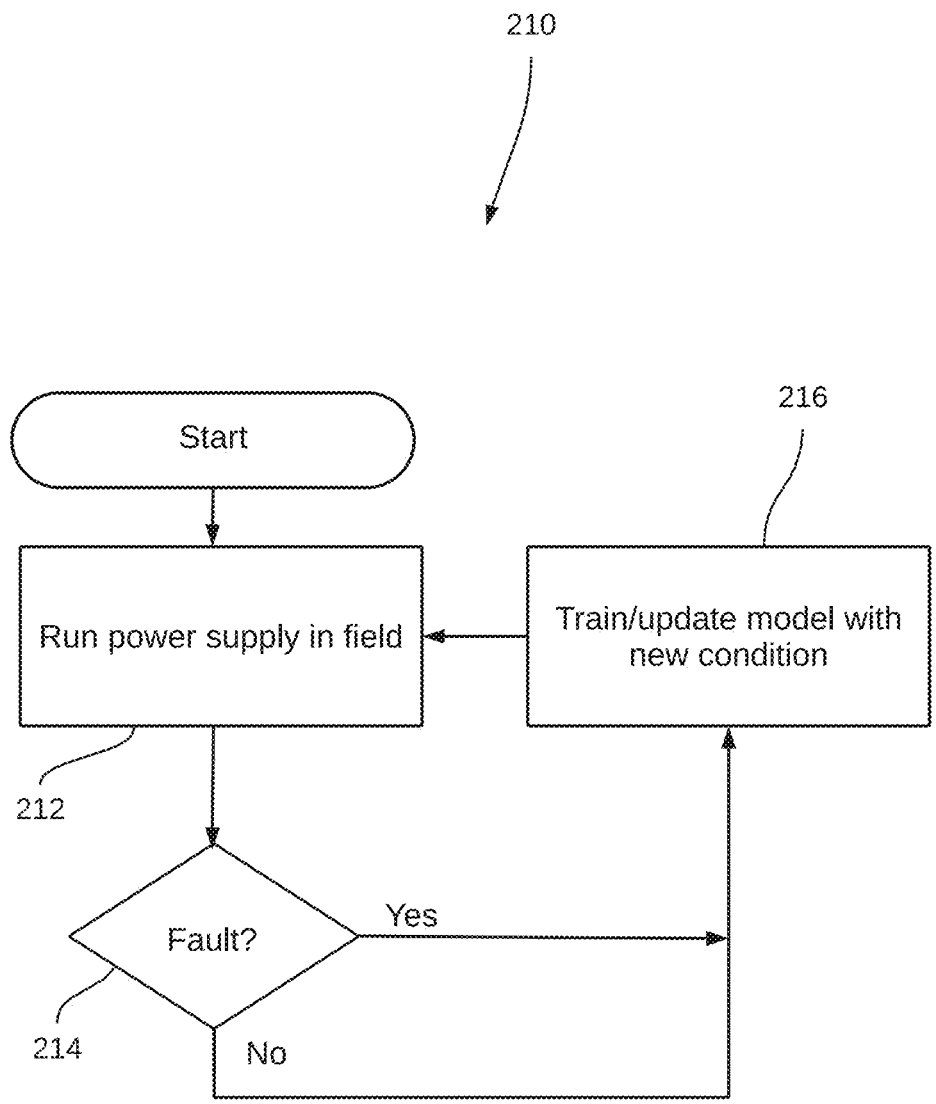
FIG. 13 is a flowchart depicting an exemplary method for continued training of the neural network according to the invention, after the power supply has been put into the field use.

FIG. 13 depicts an exemplary method 210 for continued training of neural network 150, after power supply 101 has been put into field use. In step 212, power supply 101 is run in the field, such as during normal operating use. Initially the power supply may receive trained parameter values corresponding to operation of the power supply. The trained parameter values may include parameter values obtained while running the power supply in good working conditions at 202 and parameter values obtained in various fault conditions at 206. The trained parameter values may be stored in nonvolatile memory in the electrostatic chuck supply 101 when the ESC supply 101 is shipped to an end operator/user of the ESC supply 101, or the trained parameter values may be communicated via communication link to the ESC supply 101. When operating in the field, the trained parameter values may continue to be updated as discussed below when any field parameter values are inconsistent with the trained parameter values.

As shown in FIG. 13, if a fault is detected in step 214, the neural network model is trained/updated with the new condition in step 216. If a fault is not detected in step 214, the model is still trained in step 216 to reinforce the good condition or to be updated with new good conditions. The training in step 216 may comprise, for example, adding to and updating the tables such as those shown in FIGS. 9 and 10 that were formed in factory training correlating various parameter values and combinations of values with a fault (0) or a normal (1) value. On an ongoing basis, the weights of any field parameter values that are inconsistent with the existing trained parameter values may be modified in the field. And the modification of weights may be continuous and automatic. Thus, the longer that power supply 101 is run in the field, the greater its pattern recognition and deep learning will be come, and the better able it will become to recognize and predict fault conditions.

As described above, aspects disclosed herein provide the ability to detect, predict and report advanced information relating to clamping performance. The end user can be alerted and safety actions can be automatically taken based on the training and pattern recognition developed by advisor module 102 and neural network 150. For example, and without limitation, automatic actions such as changing the clamp waveform or providing a special declamp waveform can be taken based on inconsistencies between trained parameter values and current parameter values. Statistical data on good clamps and bad clamps can be recorded and reported, thereby offering useful troubleshooting data. A bad workpiece clamp can be predicted using the trained data set model provided by advisor module 102 and neural network 150 before the bad clamp occurs. The exact change in a particular value that caused a fault can be pinpointed, and neural network 150 can be updated and retrained so as to be able to predict future faults. Any process change that caused better or worse (changed) clamping performance can be scored, whether the change was intentional or not. This is ideal for users working in R&D trying to develop an ideal wafer processing remedy.

In addition, a self-hardware check to detect errors or defects within the ESC hardware itself can be conducted, and alerts provided if the unit needs servicing. This helps to ensure that neural network 150 is not improperly trained on faulty hardware. For example, a loose or broken high voltage output cable should be detected first by the self-health check before attempting to accept training data about the process. The present invention can provide a very rigorous built-in self-factory test before being put into the field by detecting errors or defects within the ESC itself, thus providing deeper quality control than is possible with solely human factory testing. For example, a noisy signal test result may be rejected by the self-health system where a human tester may have passed the unit. Reports can also be auto generated to update, for example, a spreadsheet upon download. Final test data can be analyzed for each unit put in the field, thereby increasing yield of manufactured units and reducing human error during final factory testing.

Figure 14:
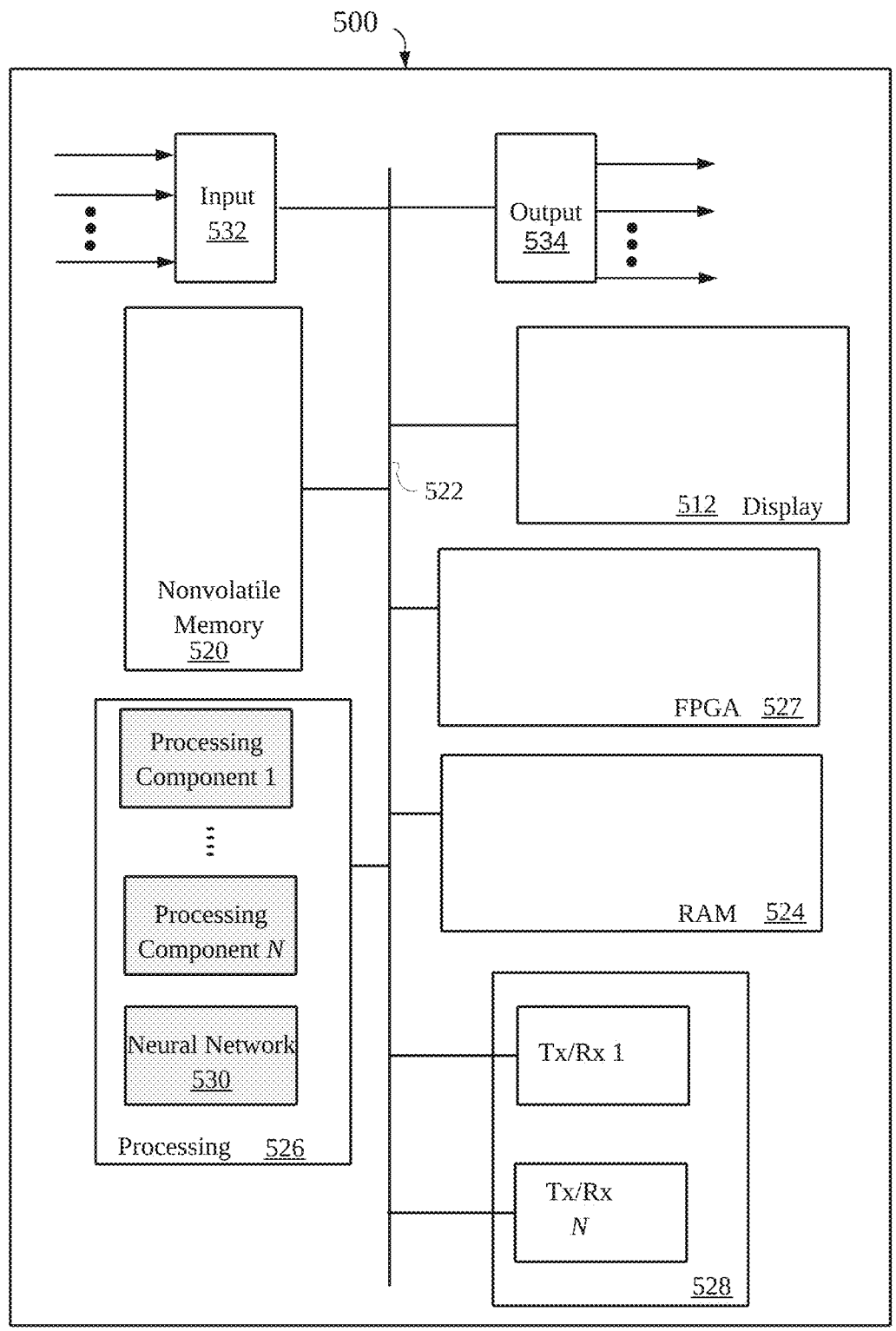
FIG. 14 is a block diagram depicting exemplary processing components that may be used to realize some embodiments described herein.

The methods described in connection with the embodiments disclosed herein may be embodied directly in hardware, in processor executable instructions encoded in non-transitory machine readable medium, or as a combination of the two. Referring to FIG. 14 for example, shown is a block diagram depicting physical components of an exemplary controller 500 that may be utilized to realize controller 103 and/or advisor module 102 according to an illustrative embodiment of this disclosure. As shown, in this embodiment, a display 512 and nonvolatile memory 520 are coupled to a bus 522 that is also coupled to random access memory (RAM) 524, a processing portion (which comprises N processing components) 526, a field programmable gate array (FPGA) 527, and a transceiver component 528 that comprises N transceivers. In addition, processing portion 526 comprises neural network 530, which as described above is implemented in advisor module 102 as neural network 150.

Although the components depicted in FIG. 14 represent physical components, FIG. 14 is not intended to be a detailed hardware diagram; thus, many of the components depicted in FIG. 14 may be realized by common constructs or distributed among additional physical components. Moreover, it is contemplated that other existing and yet-to-be developed physical components and architectures may be utilized to implement the functional components described with reference to FIG. 14.

Display 512 generally operates to provide a user interface for a user, and in some implementations, display 512 is realized by a touchscreen display. For example, display 512 can be used to control and interact with DAQ 104, ESC 108, waveform generator 120 and/or EVSM 124. For example, display 512 may display any changes or fault conditions detected by advisor module 102, as well as the updates and reports on system health as depicted in FIG. 11. In general, nonvolatile memory 520 is non-transitory memory that functions to store (e.g., persistently store) data and machine readable (e.g., processor executable) code (comprising executable code that is associated with effectuating the methods described herein). In some embodiments, for example, nonvolatile memory 520 comprises bootloader code, operating system code, file system code, and non-transitory processor-executable code to facilitate the execution of the methods described herein comprising the method described with reference to FIGS. 12 and 13.

In many implementations, nonvolatile memory 520 is realized by flash memory (e.g., NAND or ONENAND memory), but it is contemplated that other memory types may also be utilized. Although it may be possible to execute the code from nonvolatile memory 520, the executable code in the nonvolatile memory is typically loaded into RAM 524 and executed by one or more of the N processing components in processing portion 526.

In operation, the N processing components in connection with RAM 524 may generally operate to execute the instructions stored in nonvolatile memory 520 to realize aspects of the functionality of controller 103 and/or advisor module 102. For example, non-transitory processor-executable instructions to effectuate the methods described with reference to FIGS. 12 and 13 may be persistently stored in nonvolatile memory 520 and executed by the N processing components in connection with RAM 524. As one of ordinary skill in the art will appreciate, processing portion 526 may include a video processor, digital signal processor (DSP), graphics processing unit (GPU), and other processing components.

In addition, or in the alternative, FPGA 527 may be configured to effectuate one or more aspects of the methodologies described herein. For example, non-transitory FPGA-configuration-instructions may be persistently stored in nonvolatile memory 520 and accessed by FPGA 527 (e.g., during boot up) to configure FPGA 527 to effectuate the functions of controller 103 and advisor module 102.

In general, input component 532 functions to receive analog and/or digital signals that may be utilized by controller 500 as described herein. It should be recognized that input component 532 may be realized by several separate analog and/or digital input processing chains, but for simplicity, input component 532 is depicted as a single functional block. In operation, input component 532 may operate to receive user data input 118 of DAQ 104 and may also receive user input to enable the user to control various components of system 100. Output component 534 generally operates to provide one or more analog or digital signals to effectuate one or more operational aspects of system 100.

Transceiver component 528 comprises N transceiver chains, which may be used for communicating with external devices via wireless or wireline networks. Each of the N transceiver chains may represent a transceiver associated with a particular communication scheme (e.g., WiFi, ethernet, universal serial bus, profibus, etc.).

In yet alternative implementations, controller 103 and advisor module 102 may be realized by a microcontroller or an application-specific integrated circuit.

Although the present invention has been described primarily with respect to an electrostatic chuck power supply, the principles of the present invention may be applied to other types of power supplies.

This description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power supply comprising:
   at least one waveform generator configured to produce a clamp waveform responsive to a clamp signal;
   at least one amplifier configured to amplify and provide the clamp waveform to an electrostatic chuck;
   an advisor module configured to:
      receive a representation of parameter values for parameters affecting operation of the power supply;
      use a neural network to determine whether the parameter values are consistent with trained parameter values, and modify weighting of inputs to the neural network when any of the parameter values are inconsistent with the trained parameter values; and
   a controller configured to:
      provide the clamp signal to the at least one waveform generator;
      receive reports from the advisor module; and
      perform at least one of adjusting the clamp signal or providing a status report when any of the parameter values are inconsistent with the trained parameter values.

2. The power supply of claim 1, wherein the controller is configured to adjust the clamp signal responsive to selected ones of the parameter values being inconsistent with the trained parameter values.

3. The power supply of claim 1, wherein the controller is configured to adjust a bias voltage offset responsive to selected ones of the parameter values being inconsistent with the trained parameter values.

4. The power supply of claim 1, wherein the controller is configured to adjust a declamp waveform responsive to an inconsistency of the parameter values indicating that a workpiece did not declamp from the electrostatic chuck.

5. The power supply of claim 1, wherein the controller is configured to score, based upon reports from the advisor module, any process change that causes a changed clamping performance.

6. The power supply of claim 1, wherein the controller is configured to provide, based upon reports from the advisor module, a self-hardware check to indicate whether there are anomalies within hardware of the power supply.

7. The power supply of claim 1, wherein the parameter values are selected from a group consisting of voltage, current, temperature, capacitances, resistance, humidity, and shock.

8. The power supply of claim 1, further comprising a data acquisition system, wherein the data acquisition system obtains the parameter values and provides the parameter values to the controller, and wherein the controller provides the parameter values to the advisor module.

9. The power supply of claim 8, further comprising an electrostatic voltmeter that measures a voltage of a workpiece clamped to the electrostatic chuck.

10. The power supply of claim 9, wherein the data acquisition system obtains the parameter values from at least one of a group consisting of the electrostatic voltmeter, the waveform generator and the amplifier.

11. A non-transitory processor-readable medium encoded with instructions for monitoring power applied by a power supply, the instructions comprising instructions to:
    receive a representation of parameter values affecting current operating conditions of the power supply;
    access trained parameter values corresponding to previous operation of the power supply;
    update a plurality of weights of inputs to a neural network based at least in part on the parameter values affecting current operating conditions of the power supply; and
    perform at least one of adjusting a clamp signal or providing a status report when the parameter values are inconsistent with the trained parameter values.

12. The non-transitory processor-readable medium of claim 11, further comprising instructions to:
    continuously obtain the parameter values from an electrostatic chuck power supply, the parameter values comprising at least one of voltage, current, temperature, capacitances, resistance, humidity, and shock.

13. The non-transitory processor-readable medium of claim 12, wherein the parameter values include at least one of voltage and current conditions within or output by a signal generator; voltage and current conditions within or output by an amplifier; and workpiece voltage measurements obtained by an electrostatic voltmeter.

14. The non-transitory processor-readable medium of claim 11, wherein the status report comprises at least one of overall system health, operational status of specific field parameter values, and a risk that a certain fault condition will occur.

15. A processing system comprising:
a plasma processing chamber comprising an electrostatic chuck;
a power supply comprising:
- at least one waveform generator configured to produce a clamp waveform responsive to a clamp signal;
- at least one amplifier configured to provide an amplified clamp waveform to the electrostatic chuck;
- means for receiving a representation of parameter values for parameters affecting operation of the power supply;
- means for processing the parameter values to determine whether the parameter values are consistent with trained parameter values; and
- means for modifying weighting of parameter values when any parameter values are inconsistent with the trained parameter values; and a controller configured to:
- provide the clamp signal to the at least one waveform generator; and
- perform at least one of adjusting the clamp signal or providing a status report when any parameter values are inconsistent with the trained parameter values.

16. The processing system of claim 15, further comprising a data acquisition means for obtaining and providing the parameter values to the controller.

17. The processing system of claim 16, further comprising an electrostatic voltmeter that measures a voltage of a workpiece clamped to the electrostatic chuck, and that provides a measured voltage of the workpiece to the data acquisition means.

* * * * *